US012564102B2

(12) United States Patent
Kim

(10) Patent No.: US 12,564,102 B2
(45) Date of Patent: Feb. 24, 2026

(54) SEMICONDUCTOR PACKAGE

(71) Applicant: Samsung Electronics Co., Ltd.,
Suwon-si (KR)

(72) Inventor: Yong Ho Kim, Hwaseong-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 34 days.

(21) Appl. No.: 18/169,713

(22) Filed: Feb. 15, 2023

(65) Prior Publication Data

US 2023/0197683 A1 Jun. 22, 2023

Related U.S. Application Data

(63) Continuation of application No. 17/196,470, filed on
Mar. 9, 2021, now Pat. No. 11,600,596.

(30) Foreign Application Priority Data

Jul. 10, 2020 (KR) ........................ 10-2020-0085439

(51) Int. Cl.
H01L 25/065 (2023.01)
H01L 23/00 (2006.01)
H01L 23/538 (2006.01)

(52) U.S. Cl.
CPC ...... H01L 25/0655 (2013.01); H01L 23/5383
(2013.01); H01L 23/5384 (2013.01);
(Continued)

(58) Field of Classification Search
CPC . H01L 24/06; H01L 24/16; H01L 2224/0401;
H01L 2224/16227;
(Continued)

(56) References Cited

U.S. PATENT DOCUMENTS 9,673,093 B2 6/2017 Hsieh et al.
2002/0000665 A1* 1/2002 Barr ................. H01L 21/76843
257/E21.585
(Continued)

FOREIGN PATENT DOCUMENTS

KR 10-2011-0128120 A 11/2011
KR 10-2020-0029812 A 3/2020

OTHER PUBLICATIONS

Notice of Allowance issued Nov. 3, 2022 in U.S. Appl. No.
17/196,470.
(Continued)

*Primary Examiner* — Lawrence C Tynes, Jr.
(74) *Attorney, Agent, or Firm* — Harness, Dickey &
Pierce, P.L.C.

(57) ABSTRACT

A semiconductor package includes a redistribution layer
including, a first insulating layer including a first trench, a
first conductive layer including a first conductive region
extending along a top surface of the first insulating layer and
a second conductive region disposed inside the first trench,
a second insulating layer on the first conductive layer and the
first insulating layer, the second insulating layer including a
second trench at least partially overlapping the first trench,
the second trench exposing a part of the first conductive
region and a second conductive layer including a third
conductive region extending along a top surface of the
second insulating layer and a fourth conductive region
disposed on the second conductive region inside a via trench
including sidewalls of the first trench and the second trench,
and wherein the second and fourth conductive regions have
a width in a range of 20 μm to 600 μm.

20 Claims, 11 Drawing Sheets

(52) U.S. Cl.
   CPC .............. *H01L 24/06* (2013.01); *H01L 24/16*
         (2013.01); *H01L 2224/0401* (2013.01); *H01L*
                           *2224/16227* (2013.01)

(58) Field of Classification Search
   CPC ......... H01L 2224/13025; H01L 23/485; H01L
         23/5383; H01L 23/5385; H01L 25/0655;
                 H01L 25/0652; H01L 2225/1023
   See application file for complete search history.

(56)                References Cited

U.S. PATENT DOCUMENTS

| | | | |
|---|---|---|---|
| 2010/0062600 | A1 | 3/2010 | Utsuki |
| 2012/0080791 | A1* | 4/2012 | Barth ................ H01L 23/53266 |
| | | | 438/653 |
| 2013/0161702 | A1 | 6/2013 | Chen |
| 2017/0062387 | A1 | 3/2017 | Hong et al. |
| 2019/0006283 | A1 | 1/2019 | Wang et al. |
| 2019/0035750 | A1 | 1/2019 | Han et al. |
| 2019/0164918 | A1 | 5/2019 | Shindo |
| 2019/0348352 | A1* | 11/2019 | Huang .................. H01L 21/486 |
| 2020/0035584 | A1* | 1/2020 | Chen ................... H01L 21/4857 |
| 2020/0411636 | A1 | 12/2020 | Kao et al. |
| 2021/0098421 | A1 | 4/2021 | Wu et al. |
| 2021/0134712 | A1 | 5/2021 | Tu et al. |

OTHER PUBLICATIONS

Decision for Allowance issued Sep. 15, 2024 in Korean Application
No. 10-2020-0085439.

* cited by examiner

SEMICONDUCTOR PACKAGE

CROSS-REFERENCE TO RELATED APPLICATIONS

This application is a Continuation of U.S. application Ser. No. 17/196,470, filed on Mar. 9, 2021, which claims priority from Korean Patent Application No. 10-2020-0085439 filed on Jul. 10, 2020 in the Korean Intellectual Property Office, and all the benefits accruing therefrom under 35 U.S.C. 119, the contents of each of which in their entirety are herein incorporated by reference.

BACKGROUND

1. Technical Field

The present disclosure relates to a semiconductor package.

2. Description of the Related Art

With the development of the electronic industry, the demand for high functionality, high speed and miniaturization of electronic components is increasing. Accordingly, as semiconductor chips are required to be highly integrated, the formation of interconnections between semiconductor chips included in a semiconductor package also becomes complicated and difficult.

Accordingly, there is a need for a stack via in which vias are overlapped in a redistribution layer disposed in a semiconductor package. However, in the case of the stack via, as the redistribution layer has a more stacked structure, it is affected by a stacked insulating layer, which leads to a larger dimple. That is, in the case of a highly stacked via, a level difference on the top surface becomes large.

Due to the increase in the level difference, a defect may occur in the etching of the insulating material during the formation of the stack via, and accordingly, a residual insulating material may exist between the stack vias, thereby causing a structural risk of the redistribution layer.

SUMMARY

In order to avoid this risk, in one or more example embodiments, a semiconductor package maintains the level difference of the stack via that is highly stacked to be similar to that of one insulating layer.

Example embodiments relate to a semiconductor package including a redistribution layer in which the level difference of the stack via layer that is highly stacked is reduced.

Example embodiments also relate to a semiconductor package including a stack via and a redistribution layer in which the trenches for the vias are spaced apart from each other.

However, example embodiments are not restricted to those set forth herein. The above and other example embodiments will become more apparent to one of ordinary skill in the art to which the present disclosure pertains by referencing the detailed description given below.

At least one example embodiment relates to a semiconductor package including a first semiconductor chip including a first surface and a second surface opposite to the first surface; and a redistribution layer on a first surface of the first semiconductor chip, the redistribution layer configured to electrically connect to the first semiconductor chip, the redistribution layer including, a first insulating layer including a first trench, a first conductive layer including a first conductive region extending along a top surface of the first insulating layer and a second conductive region inside the first trench, a second insulating layer on the first conductive layer and the first insulating layer, the second insulating layer including a second trench at least partially overlapping the first trench such that the second trench exposes a part of the first conductive region, and a second conductive layer including a third conductive region extending along a top surface of the second insulating layer and a fourth conductive region on the second conductive region inside a via trench, the via trench including sidewalls of the first trench and the second trench, wherein widths of each of the second and fourth conductive regions are in a range of 20 μm to 600 μm.

At least one example embodiment relates to a semiconductor package comprising: a first semiconductor chip and a second semiconductor chip apart from each other in a first direction; and a redistribution layer including a first surface having the first and second semiconductor chips thereon and a second surface opposite to the first surface, the second surface being on a substrate, the redistribution layer configured to electrically connect the first and second semiconductor chips, the redistribution layer including, a first insulating layer including a first trench, a first conductive layer including a first conductive region extending along a top surface of the first insulating layer and a second conductive region inside the first trench, a second insulating layer on the first conductive layer and the first insulating layer, the second insulating layer including a second trench at least partially overlapping the first trench such that the second trench exposes a part of the first conductive region, and a second conductive layer including a third conductive region extending along a top surface of the second insulating layer and a fourth conductive region on the second conductive region inside a first via trench, the first via trench including sidewalls of the first trench and the second trench, wherein widths of the second and fourth conductive regions are in a range of 20 μm to 600 μm.

At least one example embodiment relates to a semiconductor package including a first semiconductor chip including a first surface and a second surface opposite to the first surface; a second semiconductor chip including a third surface facing the first surface of the first semiconductor chip and a fourth surface opposite to the third surface; and a redistribution layer between the first surface of the first semiconductor chip and the third surface of the second semiconductor chip, the redistribution layer configured to electrically connect the first semiconductor chip to the second semiconductor chip, the redistribution layer including, a first insulating layer including a first trench, a first conductive layer including a first conductive region extending along a top surface of the first insulating layer and a second conductive region inside the first trench, a second insulating layer on the first conductive layer and the first insulating layer, the second insulating layer including a second trench at least partially overlapping the first trench such that the second trench exposes a part of the first conductive region, and a second conductive layer including a third conductive region extending along a top surface of the second insulating layer and a fourth conductive region on the second conductive region inside a via trench, the via trench including sidewalls of the first trench and the second trench, wherein widths of each of the second and fourth conductive regions are in a range of 20 μm to 600 μm.

BRIEF DESCRIPTION OF THE DRAWINGS

The above and other aspects and features of the present disclosure will become more apparent by describing in detail example embodiments thereof with reference to the attached drawings, in which:

FIG. 2 is a cross-sectional view of the semiconductor package, taken along line A-A' of FIG. 1;

FIG. 3 is an enlarged view of area R2 of FIG. 2;

FIG. 4 is a view illustrating a stack via structure of the semiconductor package according to some example embodiments of the present disclosure;

FIGS. 5 and 6 are diagrams illustrating a semiconductor package according to some other example embodiments of the present disclosure;

FIG. 9 is a diagram illustrating a semiconductor package according to some other example embodiments of the present disclosure;

FIG. 10 is a diagram illustrating a semiconductor package according to some other example embodiments of the present disclosure; and FIG. 11 is a diagram illustrating a semiconductor package according to some other example embodiments of the present disclosure.

DETAILED DESCRIPTION

Hereinafter, example embodiments of the present disclosure will be described with reference to the accompanying drawings. In following description made with reference to FIGS. 1 to 11, the same reference numbers are used to refer to substantially the same components, and a redundant description of the corresponding components will be omitted. Like reference numbers refer to like elements throughout the various drawings.

Figure 1:
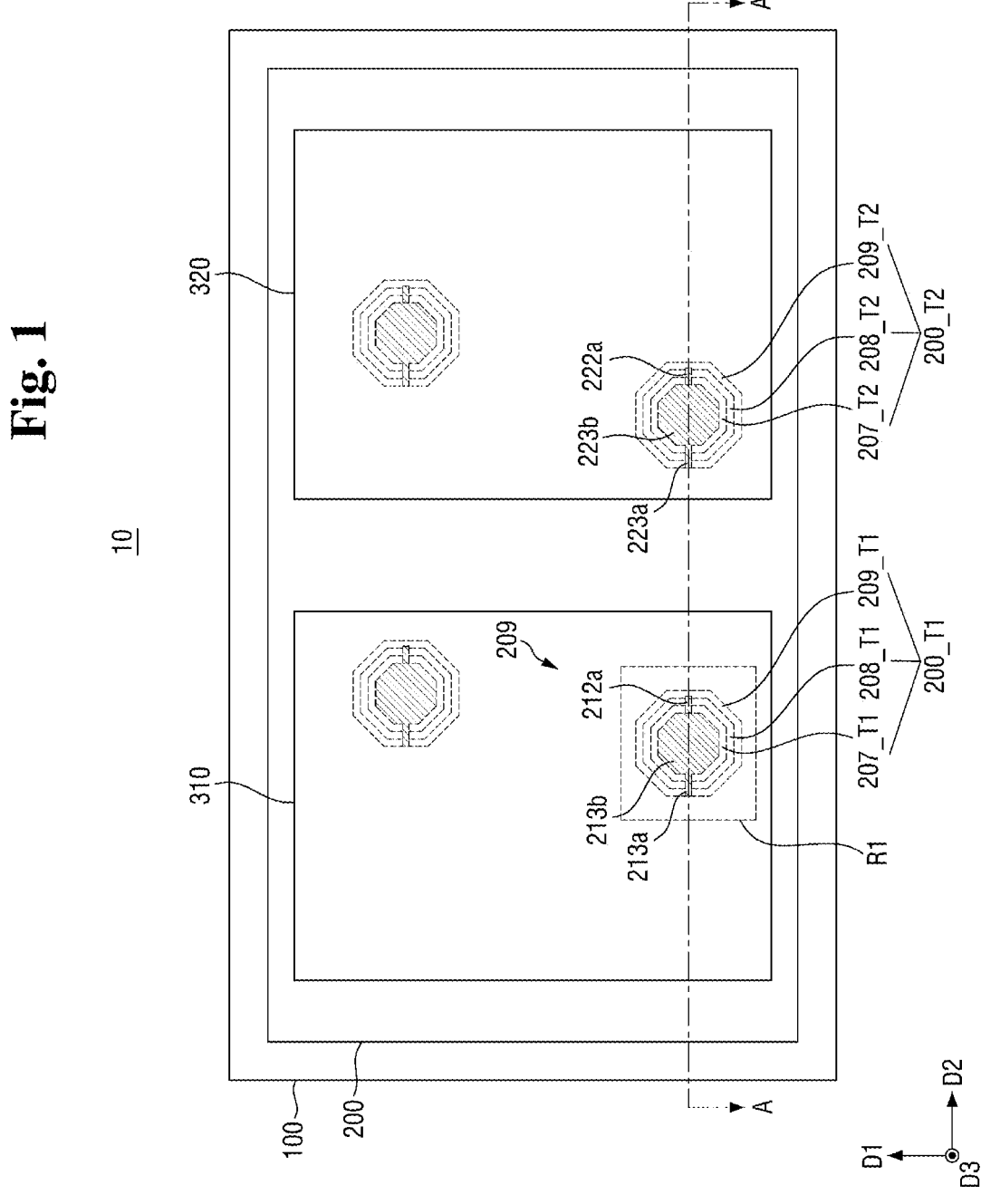
FIG. 1 is a plan view illustrating a semiconductor package according to some example embodiments of the present disclosure.
Figure 2:
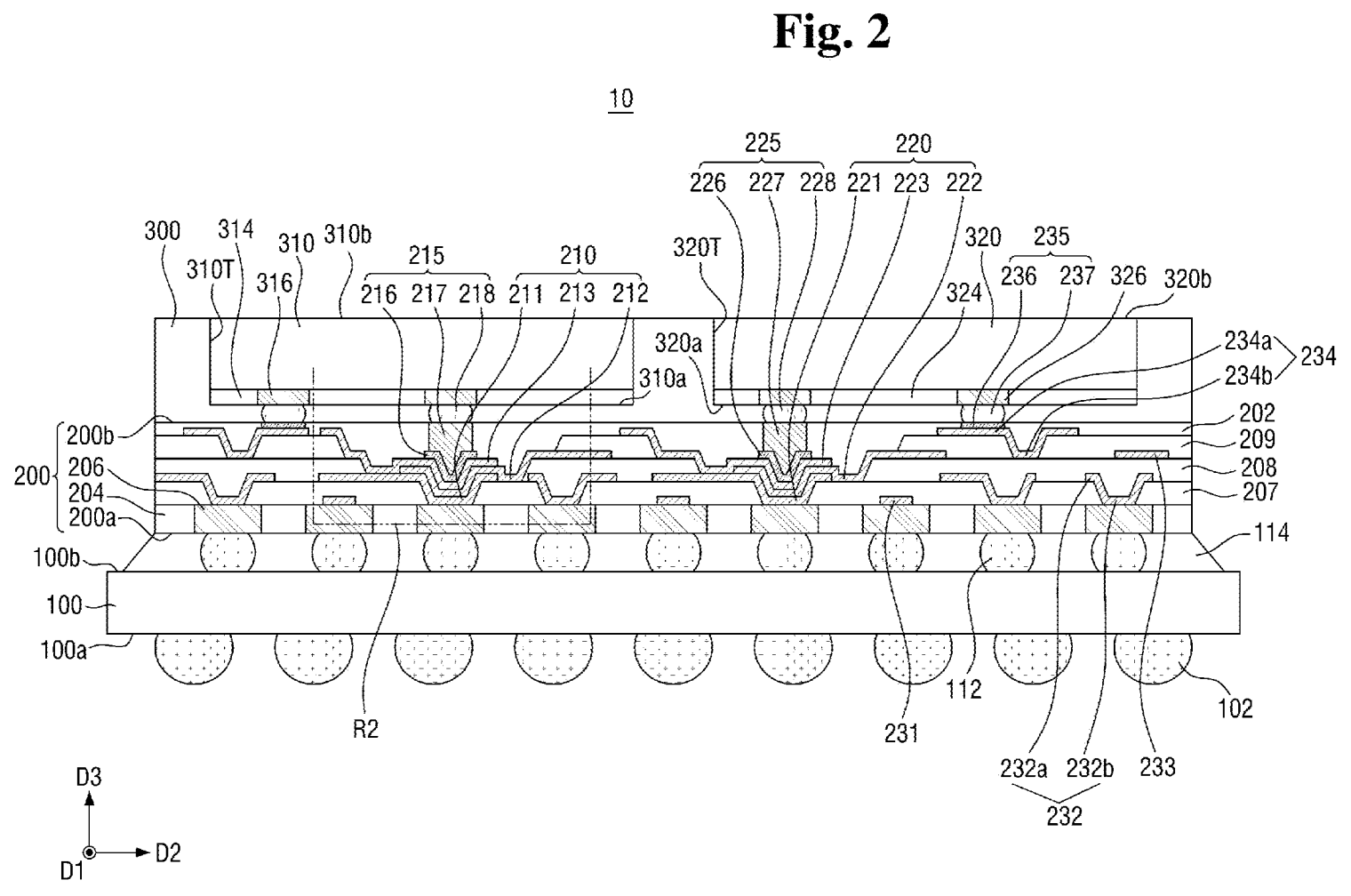
Figure 3:
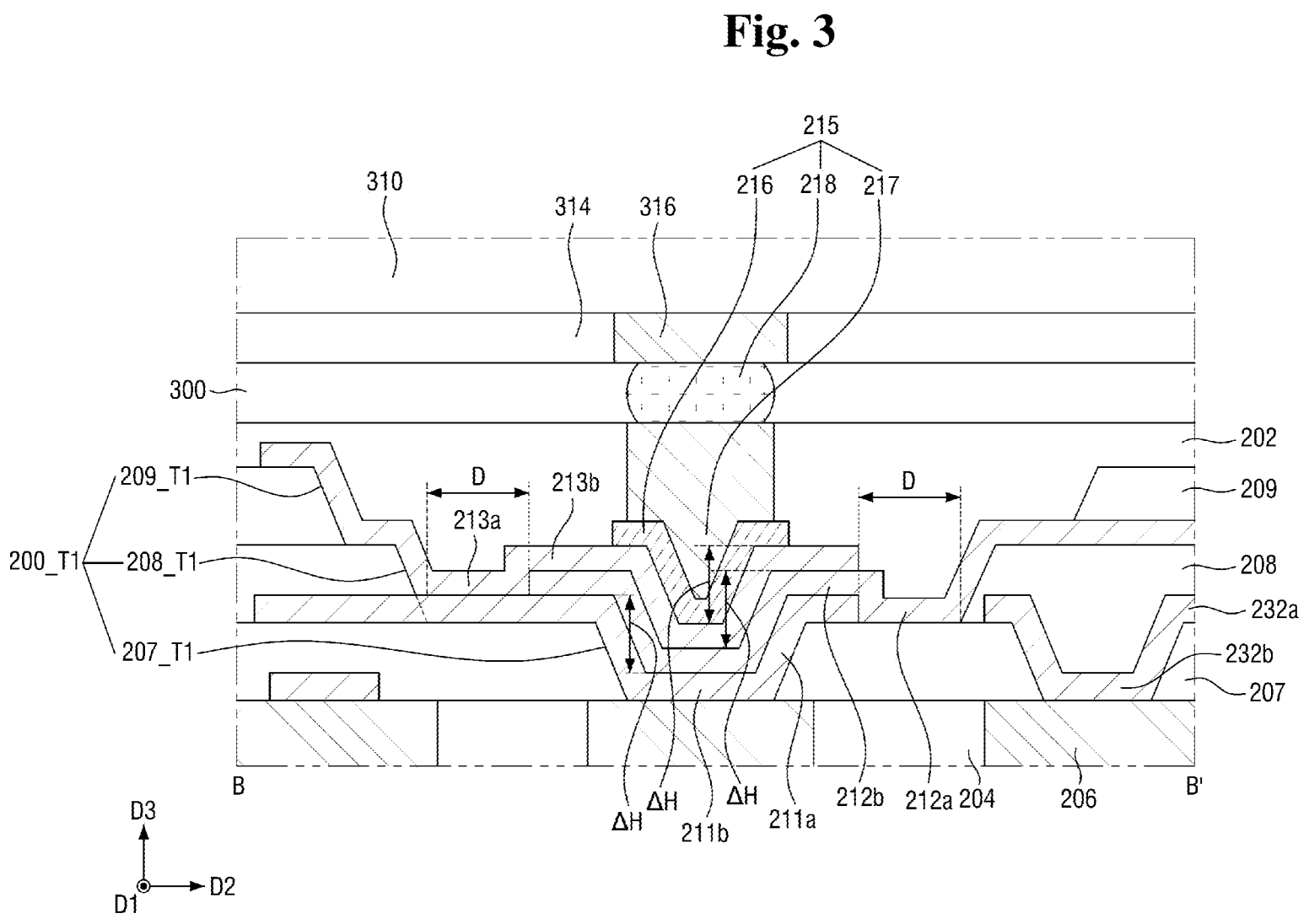

FIG. 1 is a plan view illustrating a semiconductor package 10 according to some example embodiments of the present disclosure. FIG. 1 is a view in which a stack via structure is projected into a semiconductor package 10. FIG. 2 is a cross-sectional view of the semiconductor package 10, taken along line A-A' of FIG. 1. FIG. 3 is an enlarged view of area R2 of FIG. 2.

Referring to FIGS. 1 to 3, the semiconductor package 10 according to some example embodiments of the present disclosure may include a substrate 100, an external connection terminal 102, an underfill material 114, an internal connection terminal 112, a redistribution layer 200, a molding layer 300, and first and second semiconductor chips 310 and 320.

The substrate 100 may include a first surface 100a and a second surface 100b opposite to each other. The first surface 100a of the substrate 100 may refer to a bottom surface of the substrate 100 with respect to a third direction D3, and the second surface 100b of the substrate 100 may refer to a top surface of the substrate 100 with respect to the third direction D3.

The substrate 100 may be a package substrate, for example, a printed circuit board (PCB), a ceramic substrate or the like. When the substrate 100 is the printed circuit board, the substrate 100 may be formed of at least one material selected from phenol resin, epoxy resin, or polyimide. For example, the substrate 100 may include at least one material selected from the group including Flame Retardant 4 (FR4), tetrafunctional epoxy, polyphenylene ether, epoxy/polyphenylene oxide, bismaleimide triazine (BT), Thermount, cyanate ester, polyimide and a liquid crystal polymer. Although the substrate 100 may have a surface covered by a solder-resist, the technical spirit of the present disclosure is not limited thereto.

The external connection terminal 102 may be disposed on the first surface 100a of the substrate 100. The external connection terminal 102 may convexly protrude from the first surface 100a of the substrate 100. The external connection terminal 102 may electrically connect the semiconductor package with an external device. The external connection terminals 102 may be formed in, for example, a ball grid array (BGA).

The internal connection terminal 112 may be disposed on the second surface 100b of the substrate 100. The internal connection terminal 112 may be disposed between the substrate 100 and the redistribution layer 200. The internal connection terminals 112 may convexly protrude from the second surface 100b of the substrate 100. In the drawing, the internal connection terminal 112 is illustrated to have a ball shape, but the present disclosure is not limited thereto. Further, the size or shape of the internal connection terminal 112 may be substantially the same as that of the external connection terminal 102, or may be different from that of the external connection terminal 102 as illustrated in the drawing. For example, the internal connection terminal 112 may have a smaller size than the external connection terminal 102.

The external and internal connection terminals 102 and 112 may include at least one of, for example, tin (Sn), indium (In), lead (Pb), zinc (Zn), nickel (Ni), gold (Au), silver (Ag), copper (Cu), antimony (Sb), bismuth (Bi), or a combination thereof, but the technical spirit of the present disclosure is not limited thereto.

The underfill material 114 may be disposed between the substrate 100 and the redistribution layer 200. The underfill material 114 may be disposed between the second surface 100b of the substrate 100 and a first surface 200a of the redistribution layer 200. The underfill material 114 may surround the internal connection terminal 112. Accordingly, the underfill material 114 may protect the internal connection terminal 112.

The underfill material 114 may include, e.g., epoxy resin, benzocyclobutyne or polyimide. However, the embodiments are not limited thereto. For example, the underfill material 114 may further include a silica filler. As another example, the underfill material 114 may include an adhesive and a flux. The flux may include an oxide film remover. As still another example, the underfill material 114 may include a silica filler or flux. As yet another example, the underfill material 114 may include a non-conductive paste.

The redistribution layer 200 may include the first surface 200a and a second surface 200b opposite to each other. The first surface 200a of the redistribution layer 200 may refer to a bottom surface of the interposer layer 200 with respect to the third direction D3, and the second surface 200b of the redistribution layer 200 may refer to a top surface of the redistribution layer 200 with respect to the third direction D3.

The second surface 200b of the redistribution layer 200 may include a mold compound 202 on a third insulating layer 209, partial surfaces of first and second pillars 217 and 227, and a partial surface of a redistribution under bump metallization (UBM) 236.

The redistribution layer 200 may include a first passivation layer 204, first to third insulating layers 207 to 209, the mold compound 202, a first stack via 210, a second stack via 220, first to fourth conductive wires 231 to 234, first and second redistribution stack via bumps 215 and 225, and a redistribution bump 235.

The first passivation layer 204 may include a connection pad 206. The first passivation layer 204 may expose at least a part of the connection pad 206. The connection pad 206 may include a conductive material to be electrically connected to one or more internal connection terminals 112. Accordingly, the redistribution layer 200 may be bonded to and electrically connected to the substrate 100 through the internal connection terminals 112. The first passivation layer 204 may include, for example, an oxide layer or a nitride layer, but the present disclosure is not limited thereto.

The first to third insulating layers 207 to 209 are sequentially stacked with respect to the third direction D3. The first insulating layer 207 may be disposed on the first passivation layer 204. The second insulating layer 208 may be disposed on the first insulating layer 207, and the third insulating layer 208 may be disposed on the second insulating layer 208.

Although illustrated as three insulating layers in the drawing, the number of insulating layers is an example of the embodiments of the present disclosure, and the number of insulating layers does not limit the technical spirit of the present disclosure.

The first to third insulating layers 207 to 209 may include a thermoplastic resin such as polyimide, or composite resins of the above-described resins and an inorganic filler or a resin (e.g., prepreg, Ajinomoto build-up film (ABF), FR-4 and bismaleimide triazine (BT)) impregnated with a core material such as glass fiber (or glass cloth, glass fabric) and the inorganic filler. Alternatively, according to example embodiments, the first to third insulating layers 207 to 209 may include a photo imageable dielectric (PID).

The first insulating layer 207 may include a first trench 207_T1 and a fourth trench 207_T2. The first trench 207_T1 and the fourth trench 207_T2 may be formed to be inclined with respect to the third direction D3, but may be formed in a direction parallel to the third direction according to an example embodiment.

In addition, as will be described later in the description of a first redistribution stack via bump 215 and a second redistribution stack via bump 225, the first trench 207_T1 and the fourth trench 207_T2 may have an octagonal shape in plan view, similarly to the first redistribution stack via bump 215 and the second redistribution stack via bump 225.

The second insulating layer 208 may include a second trench 208_T1 and a fifth trench 208_T2. The second trench 208_T1 and the fifth trench 208_T2 may have an octagonal shape, similarly to the first trench 207_T1 and the fourth trench 207_T2, and may extend at a slope similar to that of the first trench 207_T1 and the fourth trench 207_T2 with respect to the third direction D3. Respective areas of the second trench 208_T1 and the fifth trench 208_T2 may overlap or include respective partial areas of the first trench 207_T1 and the fourth trench 207_T2 in plan view.

The third insulating layer 209 may include a third trench 209_T1 and a sixth trench 209_T2. The third trench 209_T1 and the sixth trench 209_T2 may have an octagonal shape, similarly to the second trench 208_T1 and the fifth trench 208_T2, and may extend at a slope similar to that of the second trench 208_T1 and the fifth trench 208_T2 with respect to the third direction D3. Respective areas of the third trench 209_T1 and the sixth trench 209_T2 may overlap or include respective partial areas of the second trench 208_T1 and the fifth trench 208_T2 in plan view.

Sidewalls of the first to third trenches 207_T1 to 209_T1 may be included in the sidewall of a first via trench 200_T1. Sidewalls of the fourth to sixth trenches 207_T2 to 209_T2 may be included in the sidewall of a second via trench 200_T2.

The fourth to sixth trenches 207_T2 to 209_T2 may respectively correspond to the first to third trenches 207_T1 to 209_T1, and thus, the first via trench 200_T1 may correspond to the second via trench 200_T2, so that it is obvious that the description of the second via trench 200_T2 is replaced with the description of the first via trench 200_T1.

As illustrated in FIG. 3, the first stack via 210 may include a first conductive layer 211, a second conductive layer 212, and a third conductive layer 213. The first conductive layer 211 may include a first wiring area 211a and a first pad area 211b. The second conductive layer 212 may include a second wiring area 212a and a second pad area 212b. The third conductive layer 213 may include a third wiring area 213a and a third pad area 213b. The first conductive layer 211, the second conductive layer 212, and the third conductive layer 213 may include a conductive material such as copper (Cu), aluminum (Al), silver (Ag), tin (Sn), gold (Au), nickel (Ni), lead (Pb), titanium (Ti), or an alloy thereof, and may be formed using damascene, electroplating, physical vapor deposition, chemical vapor deposition (CVD), plasma enhancement CVD, atomic layer deposition, or the like, and the technical spirit of the present disclosure is not limited thereto.

Figure 4:
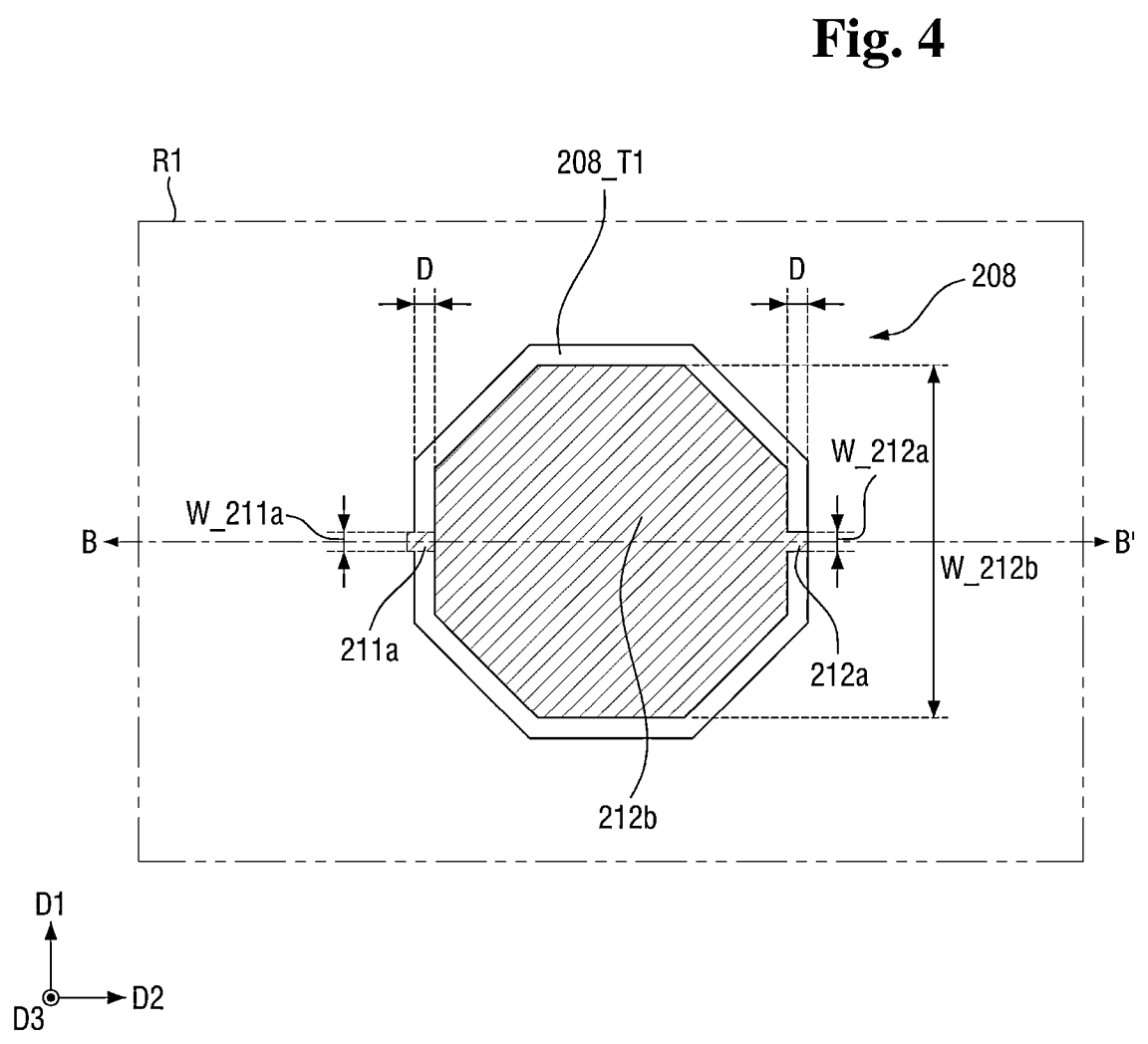

FIG. 4 is a view illustrating a stack via structure of the semiconductor package 10 according to some example embodiments of the present disclosure. FIG. 4 is a plan view illustrating the first conductive layer 211, the second conductive layer 212, and the second insulating layer 208 of the first stack via 210. The description of the first conductive layer 211 and the second conductive layer 212 may describe the structure between the adjacent conductive layers in the first stack via 210, and it is obvious that the description may be applicable to the description of the structure between the second conductive layer 212 and the third conductive layer 213. In addition, the description of a structure between the second conductive layer 212 and the second insulating layer 208 may describe the structure between the insulating layer and the conductive layer, and it is obvious that the description may be applicable to the description of the structure between the first conductive layer 211 and the first insulating layer 207 and the structure between the third conductive layer 213 and the third insulating layer 209.

Referring additionally to FIG. 4, the second wiring area 212a of the second conductive layer 212 may extend along the top surfaces of the second trench 208_T1 and the second insulating layer 208. The second wiring area 212a of the second conductive layer 212 extends along the top surface of the second insulating layer 208, so that a partial area thereof is disposed between the second insulating layer 208 and the first insulating layer 207, and a partial area thereof may be exposed by the third trench 209_T1 to be covered by the mold compound 202.

In addition, the second wiring area 212a may extend along the top surface of the second insulating layer 208 as described above and may be electrically connected to the first to fourth conductive wires 231 to 234, or the like in the redistribution layer 200.

A width W_212a of the second wiring area 212a may be in a range of 0.5 μm to 2 μm, and a width W_211a of the first wiring area 211a may also be in a range of 0.5 μm to 2 μm. The second wiring area 212a and the second pad area 212b may be distinguished by a difference in width of the structure.

The second pad area 212b of the second conductive layer 212 may be overlappingly disposed on the first pad area 211b of the first conductive layer 211, and be in direct contact with the first pad area 211b, so that other residual materials may not exist between the second pad area 212b and the first pad area 211b.

The area comparison of the first pad area 211b and the second pad area 212b in plan view may vary according to example embodiments, and the technical spirit of the present disclosure does not change according to the area comparison result.

The second pad area 212b and the second trench 208_T1 may be spaced apart by a distance D, that is, the second pad area 212b may be spaced apart by a distance D from the first via trench 200_T1. The distance D may be in a range of 2 μm to 10 μm, and the margin may be set to be wider than at least the width W_211a of the second wiring area 212a, so that disposition may be efficiently done such that no other residual material may be disposed between the first pad area 211b and the second pad area 212b in the process.

In addition, a partial area of the first wiring area 211a is exposed by the second trench 208_T1 due to the distance D between the second pad area 212b and the second trench 208_T1, and may be in contact with the third conductive layer 213.

The shape of the second pad area 212b may be an octagonal shape, which may correspond to the shape of the first redistribution stack via bump 215 to be described later.

A width W_212b of the second pad area 212b may be in a range of 20 μm to 600 μm, and may vary according to a relation with the first redistribution stack via bump 215 to be described later. The width of the first redistribution stack via bump 215 in plan view may vary depending on the type of the first redistribution stack via bump 215 and an adhesion method with other chips. The width W_212b of the second pad area 212b may have a size close to the width of the first redistribution stack via bump 215. For example, when the first redistribution stack via bump 215 has the width of 600 μm in plan view, the width W_212b of the second pad area 212b may also be 600 μm. As described above, the second pad area 212b and the second wiring area 212a may be distinguished by a difference in width of the structure.

In a semiconductor package according to some example embodiments, a level difference of each of the top surfaces of the first pad area 211b of the first conductive layer 211, the second pad area 212b of the second conductive layer 212, and the third pad area 213b of the third conductive layer 213 in the third direction D3 may be equal to ΔH. Therefore, the structural risk to the redistribution layer 200 due to residual insulating materials existing between the stack vias 210, 220 is reduced.

The second stack via 220 may include a fourth conductive layer 221, a fifth conductive layer 222, and a sixth conductive layer 223, and the fourth to sixth conductive layers 221 to 223 may respectively correspond to the first to third conductive layers 211 to 213 of the first stack via 210, so that it is obvious that the description of the fourth to sixth conductive layers 221 to 223 may be replaced by the description of the first to third conductive layers 211 to 213.

In the first to fourth conductive wires 231 to 234, the first conductive wire 231 may be disposed on the first passivation layer 204 or the connection pad 206 to be directly connected to the connection pad 206, and the second conductive wire 232 may include a second_a conductive wire 232a extending along the top surface of the first insulating layer 207 and a second_b conductive wire 232b electrically connecting the top surface of the first insulating layer 207 to the connection pad 206, according to example embodiments. The third conductive wire 233 may extend along the top surface of the second insulating layer 208 according to example embodiments, and the fourth conductive wire 234 may include a fourth_a conductive wire 234a extending along the top surface of the third insulating layer 209 to be in contact with the redistribution UBM 236 and a fourth_b conductive wire 234b extending from the top surface of the third insulating layer 209 to the top surface of the second insulating layer 208, according to the embodiment. The disposition of the first to fourth conductive wires 231 to 234 may vary according to example embodiments, and the disposition of the first to fourth conductive wires 231 to 234 does not limit the technical spirit of the present disclosure.

The first redistribution stack via bump 215 may include a first redistribution under barrier metal (UBM) 216, a first pillar 217, and a first paste 218.

The first redistribution UBM 216 may serve as an adhesive layer, a diffusion prevention layer, and a wetting layer, and be disposed on the third pad area 213b, and may overlap and be in contact with the third pad area 213b to be electrically connected thereto. The first redistribution UBM 216 may have an octagonal shape similar to the shape of the third pad area 213b in plan view, which may also coincide with the first pillar 217 and the first paste 218 according to example embodiments.

The first redistribution UBM 216 may be formed in a Cr/Cr—Cu/Cu, TiW/Cu, Al/NiV/Cu, Ti/Cu, Ni/Au or Ti/Cu/ Ni structure. The first redistribution UBM 216 may be used as a seed layer in a subsequent plating process, for example.

The first pillar 217 extends on the first redistribution UBM 216 in the third direction D3, so that a partial area thereof may be exposed by the mold compound 202. The first pillar 217 may include various metals such as nickel (Ni), copper (Cu), palladium (Pd), platinum (Pt), gold (Au), or a combination thereof.

The first paste 218 may be a conductive paste, for example, a solder paste or a metal paste. Specifically, a redistribution paste 237 may include, for example, a tin-silver (SnAg) alloy or tin (Sn).

The redistribution layer 200 may be electrically connected to the first semiconductor chip 310 through the first redistribution stack via bump 215.

The second redistribution stack via bump 225 may include a second redistribution UBM 226, a second pillar 227, and a second paste 228. The second redistribution stack via bump 225 may be overlappingly disposed on, and be in contact with the sixth conductive layer 223 of the second stack via 220 to be electrically connected thereto, and the second redistribution stack via bump 225 may be electrically connected to the second semiconductor chip 320.

The second redistribution UBM 226, the second pillar 227, and the second paste 228 may respectively correspond the first redistribution UBM 216, the first pillar 217, and the first paste 218 of the first redistribution stack via bump 215, and it is obvious that the descriptions of the second redistribution UBM 226, the second pillar 227, and the second paste 228 may be respectively replaced with the descriptions of the first redistribution UBM 216, the first pillar 217, and the first paste 218.

The redistribution bump 235 may be disposed on the fourth conductive wire 234 to be electrically connected to the fourth conductive wire 234, and according to the disposition, may be electrically connected to each of the first semiconductor chip 310 and the second semiconductor chip 320.

The redistribution bump 235 may include the redistribution UBM 236 and the redistribution paste 237. The redistribution UBM 236 may serve as an adhesive layer, a diffusion prevention layer, and a wetting layer, and a partial area thereof may be exposed by the mold compound 202. The redistribution UBM 236 may have an octagonal shape in plan view, which may also coincide with the redistribution paste 237 according to example embodiments.

The redistribution paste 237 may be a conductive paste, for example, a solder paste or a metal paste. Specifically, a redistribution paste 237 may include, for example, a tin-silver (SnAg) alloy or tin (Sn).

The semiconductor chips 310 and 320 may be disposed on the second surface 200b of the redistribution layer 200. The semiconductor chips 310 and 320 may be spaced apart from each other in a second direction D2. For example, the first semiconductor chip 310 and the second semiconductor chip 320 may be spaced apart from each other in the second direction D2 and disposed on the second surface 200b of the redistribution layer 200. Although two semiconductor chips 310 and 320 are illustrated in the drawing, the number of semiconductor chips 310 and 320 may vary without being limited thereto. The semiconductor chips 310 and 320 may be electrically connected to the substrate 100 through the redistribution layer 200.

The second semiconductor chip 320 may be, for example, a logic chip. For example, the logic chip may be a central processor unit (CPU), a micro processor unit (MPU), a graphics processor unit (GPU), a controller, or an application specific integrated circuit (ASIC), a modem chip, or the like. Alternatively, the first semiconductor chip 310 may be an application processor (AP) used in a mobile phone or a smartphone.

The first semiconductor chip 310 may be a different type of memory chip from the second semiconductor chip 320. The first semiconductor chip 310 may be, for example, a memory chip. For example, the memory chip may be a volatile memory chip such as a dynamic random access memory (DRAM) or a static random access memory (SRAM), or may be a nonvolatile memory chip such as a phase-change random access memory (PRAM), a magnetoresistive random access memory (MRAM), a ferroelectric random access memory (FeRAM) or a resistive random access memory (RRAM). The memory chip may also be a high bandwidth memory (HBM) chip in which a plurality of DRAM chips are stacked. For example, the first semiconductor chip 310 may be an HBM memory chip.

A partial area of a first chip connection pad 316 may be disposed on a first surface 310a of the first semiconductor chip 310, and the area may be exposed. The first surface 310a of the first semiconductor chip 310 may be a lower surface with respect to a second surface 310b of the first semiconductor chip 310 in to the third direction D3. A partial area of a second chip connection pad 326 may be disposed on a first surface 320a of the second semiconductor chip 320, and the corresponding area may be exposed. The first surface 320a of the second semiconductor chip 320 may be a lower surface with respect to a second surface 320b of the second semiconductor chip 320 in the third direction D3.

The first chip connection pad 316 and the second chip connection pad 326 may be respectively disposed on the first redistribution stack via bump 215 and the second redistribution stack via bump 225. Accordingly, the first chip connection pad 316 may overlap the first to third pad areas 211b, 212b, and 213b in plan view, and the second chip connection pad 326 may overlap fourth to sixth pad areas 221b, 222b, and 223b in plan view.

The first chip connection pad 316 and the second chip connection pad 326 may be substantially identical in size or shape, as illustrated in this drawing, or different in size or shape. In addition, the first chip connection pad 316 and the second chip connection pad 326 may be smaller in size than the external connection terminal 102. Alternatively, the first chip connection pad 316 and the second chip connection pad 326 may be smaller in size than the internal connection terminal 112. The first chip connection pad 316 and the second chip connection pad 326 may be, for example, at least one of tin (Sn), indium (In), lead (Pb), zinc (Zn), nickel (Ni), gold (Au), silver (Ag), copper (Cu), antimony (Sb), bismuth (Bi), or a combination thereof, but the technical spirit of the present disclosure is not limited thereto.

A second-first passivation layer 314 may be disposed on the first surface 310a of the first semiconductor chip 310. The second-first passivation layer 314 may include the first chip connection pad 316. The second-second passivation layer 324 may be disposed on the first surface 320a of the second semiconductor chip 320. The second-second passivation layer 324 may include the second chip connection pad 326. Accordingly, the first semiconductor chip 310 and the second semiconductor chip 320 may be electrically connected to the redistribution layer 200 through the first chip connection pad 316 and the second chip connection pad 326, respectively.

The first chip connection pad 316 and the second chip connection pad 326 may include a conductive material, and the second-first passivation layer 314 and the second-second passivation layer 324 may include, for example, an oxide layer or a nitride layer, but is not limited thereto.

The molding layer 300 may be disposed on the second surface 200b of the redistribution layer 200. The molding layer 300 may include a first chip trench 310T and a second chip trench 320T. The first semiconductor chip 310 may be disposed in the first chip trench 310T, and the second semiconductor chip 320 may be disposed in the second chip trench 320T. That is, the molding layer 300 may at least partially cover the first semiconductor chip 310 and the second semiconductor chip 320. The molding layer 300 may fill a space between the first and second semiconductor chips 310 and 320 and the redistribution layer 200.

The drawing illustrates that the molding layer 300 covers side surfaces of the first and second semiconductor chips 310 and 320, and exposes top surfaces thereof, but this is merely an example. For example, the molding layer 300 may cover both side and top surfaces of the first semiconductor chip 310 and the second semiconductor chip 320. The molding layer 300 may include an insulating material.

For example, the molding layer 300 may include a thermosetting resin such as an epoxy resin, a thermoplastic resin such as polyimide, or composite resins of the above-described resins and an inorganic filler or a resin (e.g., prepreg, Ajinomoto build-up film (ABF), FR-4 and bismaleimide triazine (BT)) impregnated with a core material such as glass fiber (or glass cloth, glass fabric) and the inorganic filler. Alternatively, the molding layer 300 may include a photo imageable dielectric (PID).

Figure 5:
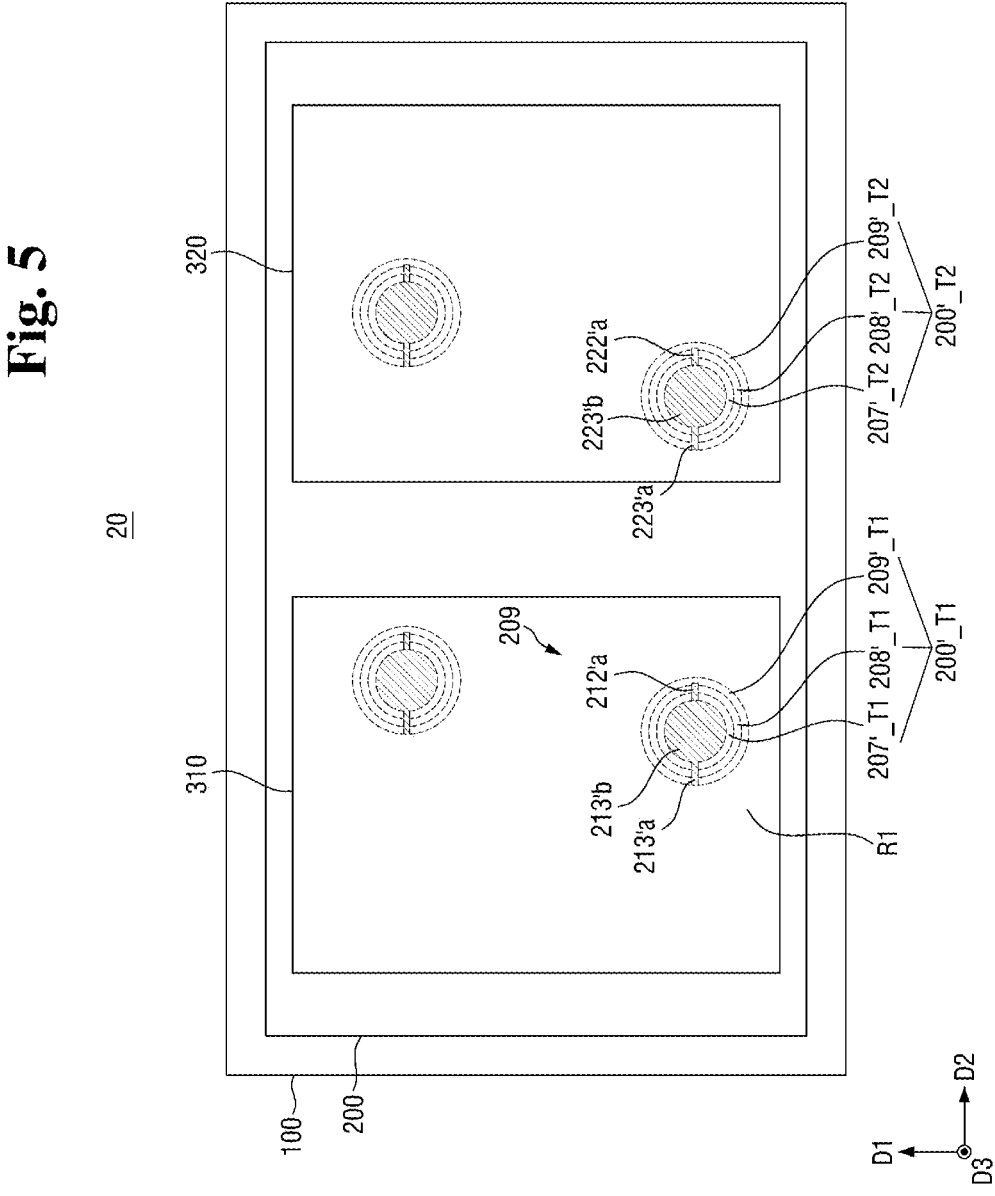
Figure 6:
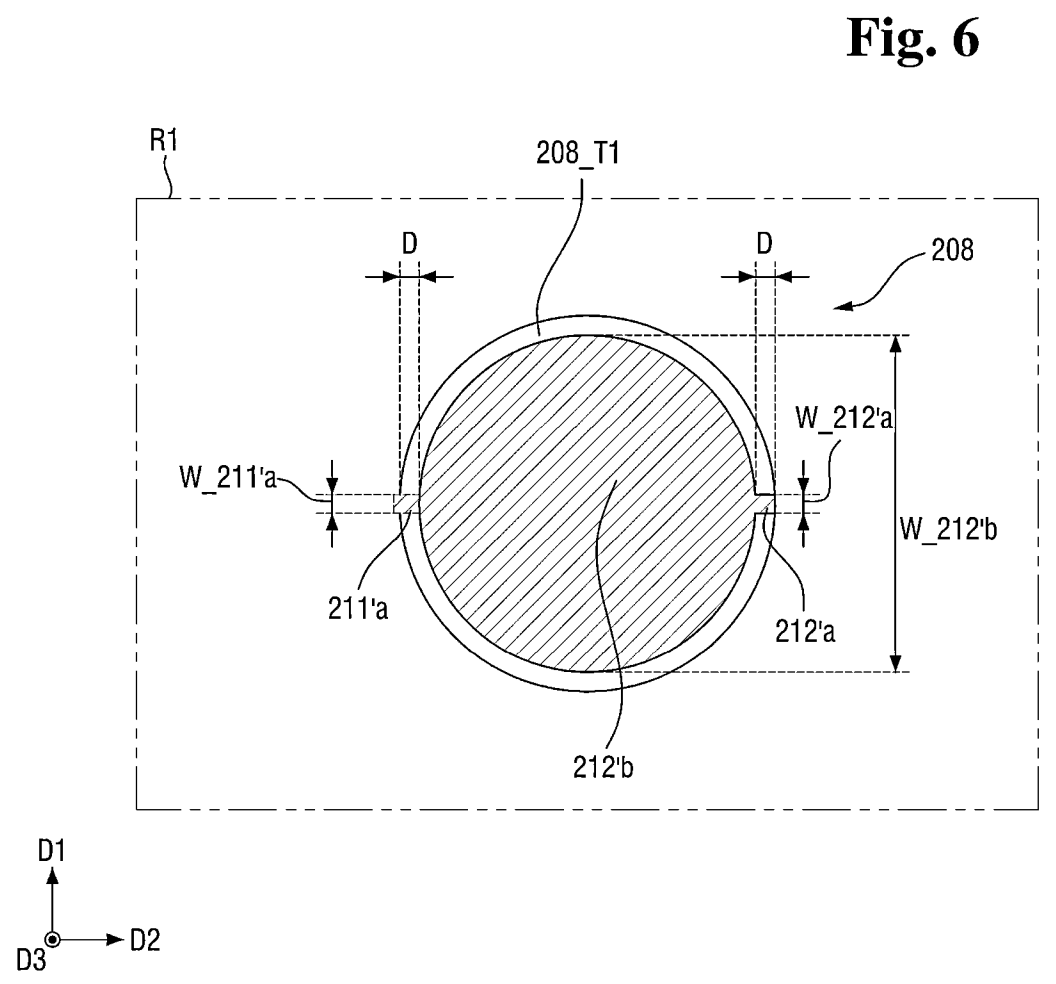

FIGS. 5 and 6 are diagrams illustrating a semiconductor package according to some other example embodiments of the present disclosure. FIG. 5 is a view in which a stack via structure is projected into the semiconductor package 20. FIG. 6 is a plan view illustrating a first conductive layer, a second conductive layer, and a second insulating layer of a first stack via. The description will focus on differences from the semiconductor package 10 of FIGS. 1 to 4.

The first stack via, a second stack via, a first via trench 200'_T1, and a second via trench 200'_T2 may correspond to the first stack via 210, the second stack via 220, the first via trench 200_T1, and the second via trench 200_T2 of the semiconductor package of FIGS. 1 to 4.

First to sixth trenches 207'_T1 to 209'_T1 and 207'_T2 to 209'_T2 have a circular shape in plan view, and accordingly, first to sixth pad areas also have a circular shape in plan view. A diameter W_212'*b* of the second pad area 212'*b* is in a range of 20 μm to 600 μm, as in the example embodiments of FIGS. 1 to 4, and the first to sixth pad areas may also be applied as well.

In addition, unlike FIGS. 1 to 6, even in a case where the shape of the redistribution stack via bump is a polygon including a square, it corresponds to the technical spirit of the present disclosure, and accordingly, the shape of the pad area of the conductive layer may also coincide with the shape of the redistribution stack via bump.

Figure 7:
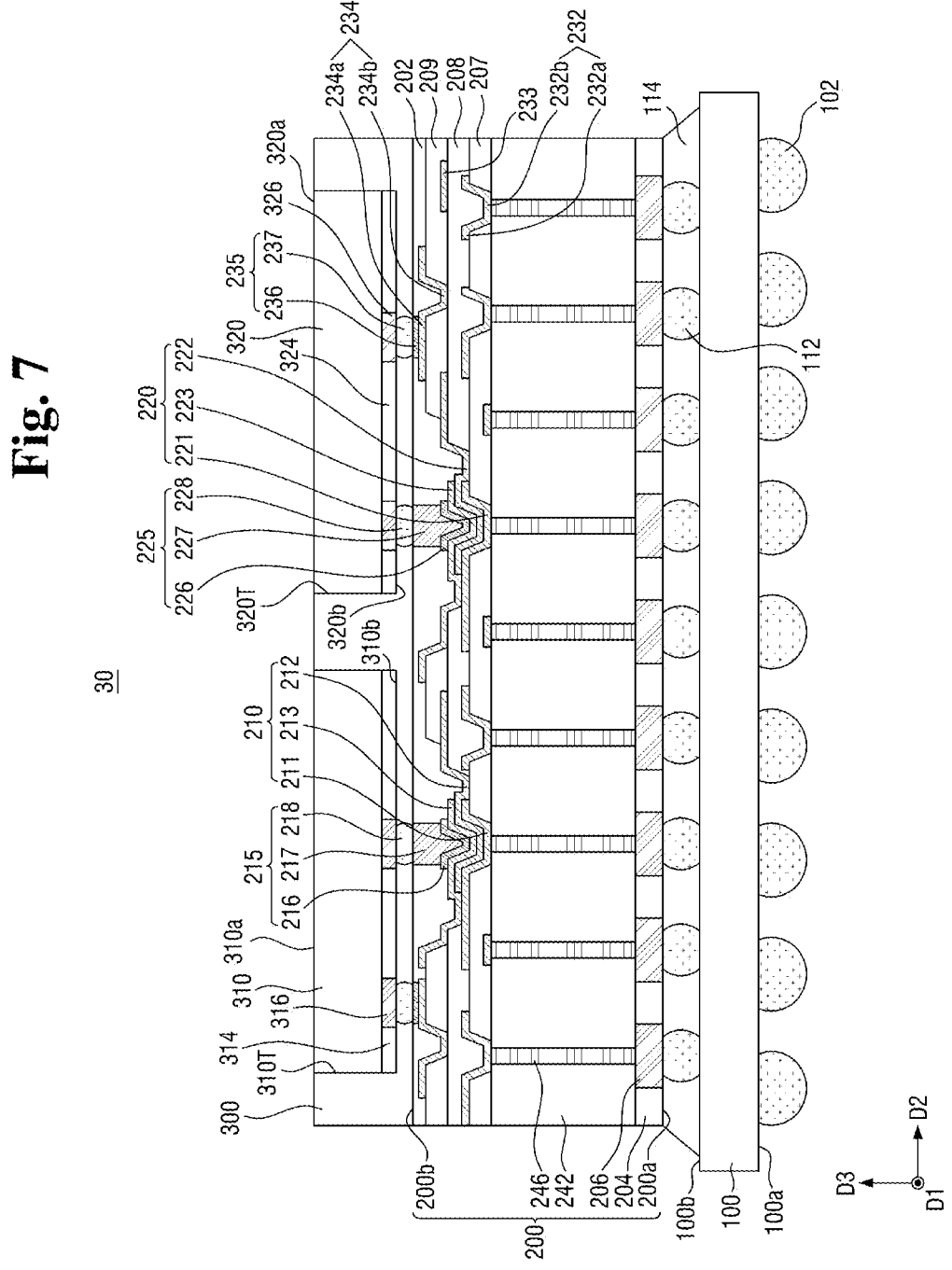
FIG. 7 is a diagram illustrating a semiconductor package according to some other example embodiments of the present disclosure.

FIG. 7 is a diagram illustrating a semiconductor package 30 according to some other example embodiments of the present disclosure. The description will focus on differences from the semiconductor package 10 of FIGS. 1 to 4.

Compared to the semiconductor package 10 of FIGS. 1 to 4, the redistribution layer 200 may further include a substrate layer 242, and the redistribution layer 200 may perform the operation of an interposer of a 2.5D stack package. The substrate layer 242 may be disposed between the first passivation layer 204 and the first insulating layer 207.

The substrate layer 242 may be disposed on the first passivation layer 204. The substrate layer 242 may include, for example, silicon (Si). The substrate layer 242 may include a first through via 246. The first through via 246 may be disposed in the substrate layer 242. The first through via 246 may extend in the third direction D3 to penetrate the substrate layer 242. The first through via 246 may have a different extension shape depending on whether the first through via 246 is formed before a front end of line (FEOL), formed between the FEOL and a back end of line (BEOL), formed during the BEOL, or formed after the BEOL.

The first through via 246 may be disposed on the connection pad 206, and according to the disposition, may be connected to the first stack via 210, the second stack via 220, the first conductive wire 231, and the second conductive wire 232. Accordingly, the connection pad 206 may be electrically connected to the first stack via 210, the second stack via 220, the first conductive wire 231, and the second conductive wire 232.

The first through via 246 may be disposed on bottom surfaces of the first redistribution stack via bump 215 and the second redistribution stack via bump 225, and thus, the first through via 246 may overlap the first and third pad areas 211*b*, 212*b*, and 213*b* in plan view, and may also overlap the fourth to sixth pad areas 221*b*, 222*b*, and 223*b* in plan view according to the disposition.

Figure 8:
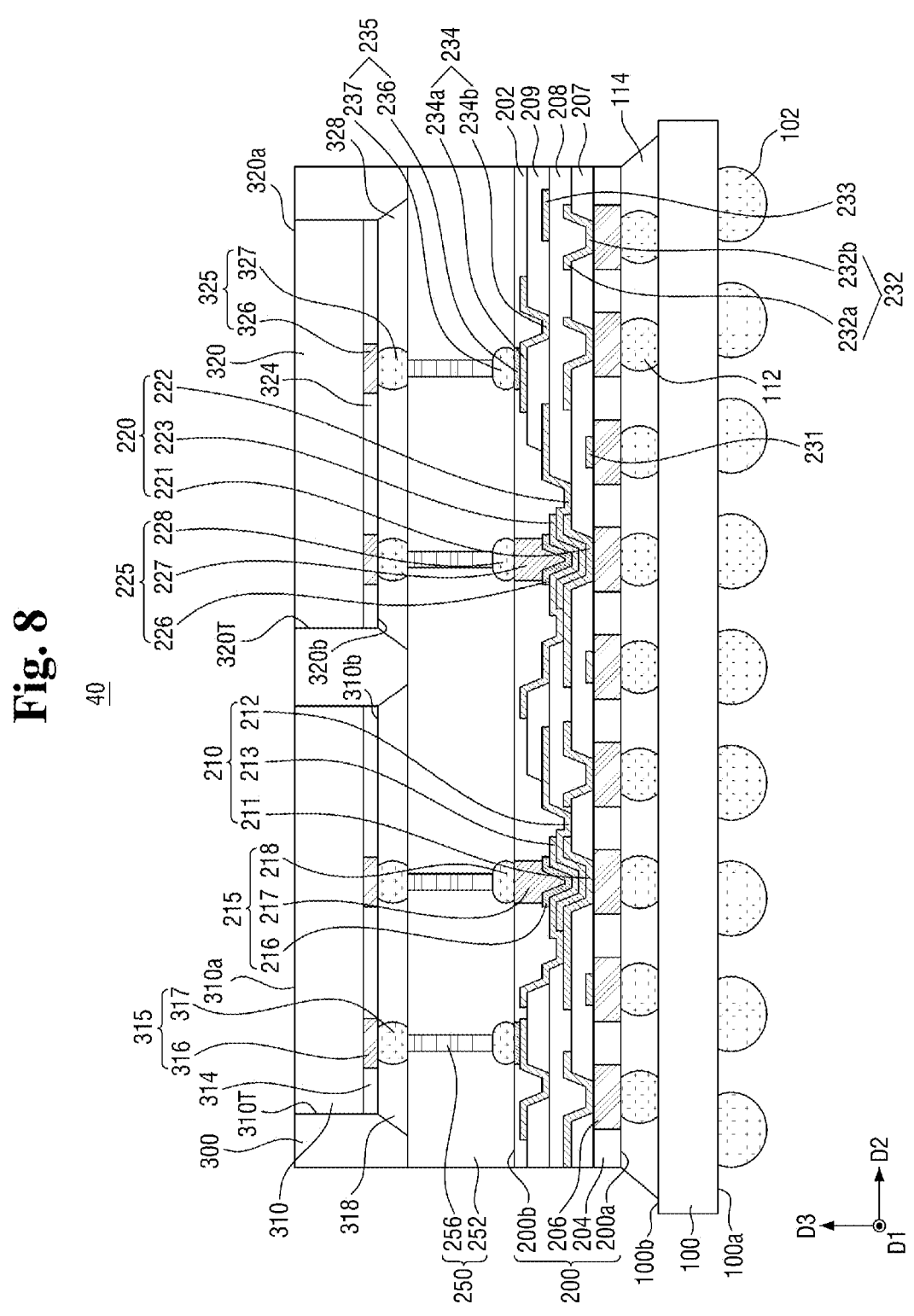
FIG. 8 is a diagram illustrating a semiconductor package according to some other example embodiments of the present disclosure.

FIG. 8 is a diagram illustrating a semiconductor package 40 according to some other example embodiments of the present disclosure. The description will focus on differences from the semiconductor package 10 of FIGS. 1 to 4.

Referring to FIG. 8, the semiconductor package 40 according to some embodiments of the present disclosure may further include a chip package 250 disposed on the second surface 200*b* of the redistribution layer 200. The chip package 250 may include a third semiconductor chip 252 and a second through via 256.

The first semiconductor chip 310 and the second semiconductor chip 320 may include a first chip paste 317 and a second chip paste 327, respectively. The first chip connection pad 316 and the first chip paste 317 may be included in a first chip bump 315, and the second chip connection pad 326 and the second chip paste 327 may be included in a second chip bump 325.

The second through via 256 may be disposed to penetrate the third semiconductor chip 252. The second through via 256 may be connected to the redistribution layer 200 and the first and second chip bumps 315 and 325 respectively disposed in first and second underfill materials 318 and 328. The second through via 256 may be disposed to penetrate the third semiconductor chip 252 in the third direction D3. The second through via 256 may be a conductive through electrode. Accordingly, the third semiconductor chip 252 may be electrically connected to the first and second semiconductor chips 310 and 320 through the second through via 256.

For example, the first and second semiconductor chips 310 and 320 may be logic chips and the third semiconductor chip 252 may be a memory chip. Alternatively, the first and second semiconductor chips 310 and 320 may be memory chips, and the third semiconductor chip 252 may be a logic chip.

The second through via 256 may be disposed on the first redistribution stack via bump 215, the second redistribution stack via bump 225, and the redistribution bump 235, and according to the disposition, through the first stack via 210, the second stack via 220, and the fourth conductive wire 234, the second through via 256 may be electrically connected to the first redistribution stack via bump 215, the second redistribution stack via bump 225, the redistribution bump 235, and the first and second chip bumps 315 and 325.

The second through via 256 may be disposed to overlap the top surfaces of the first redistribution stack via bump 215 and the second redistribution stack via bump 225, and thus, the second through via 256 may overlap the first and third pad areas 211*b*, 212*b*, and 213*b* in plan view, and may also overlap the fourth to sixth pad areas 221*b*, 222*b*, and 223*b* in plan view according to the disposition.

The first and second chip bumps 315, 325 may be respectively disposed to overlap the top surfaces of the first redistribution stack via bump 215 and the second redistribution stack via bump 225, and thus, the first chip bump 315 may overlap the first and third pad areas 211*b*, 212*b*, and 213*b* in plan view, and the second chip bump 325 may also overlap the fourth to sixth pad areas 221*b*, 222*b*, and 223*b* in plan view.

Figure 9:
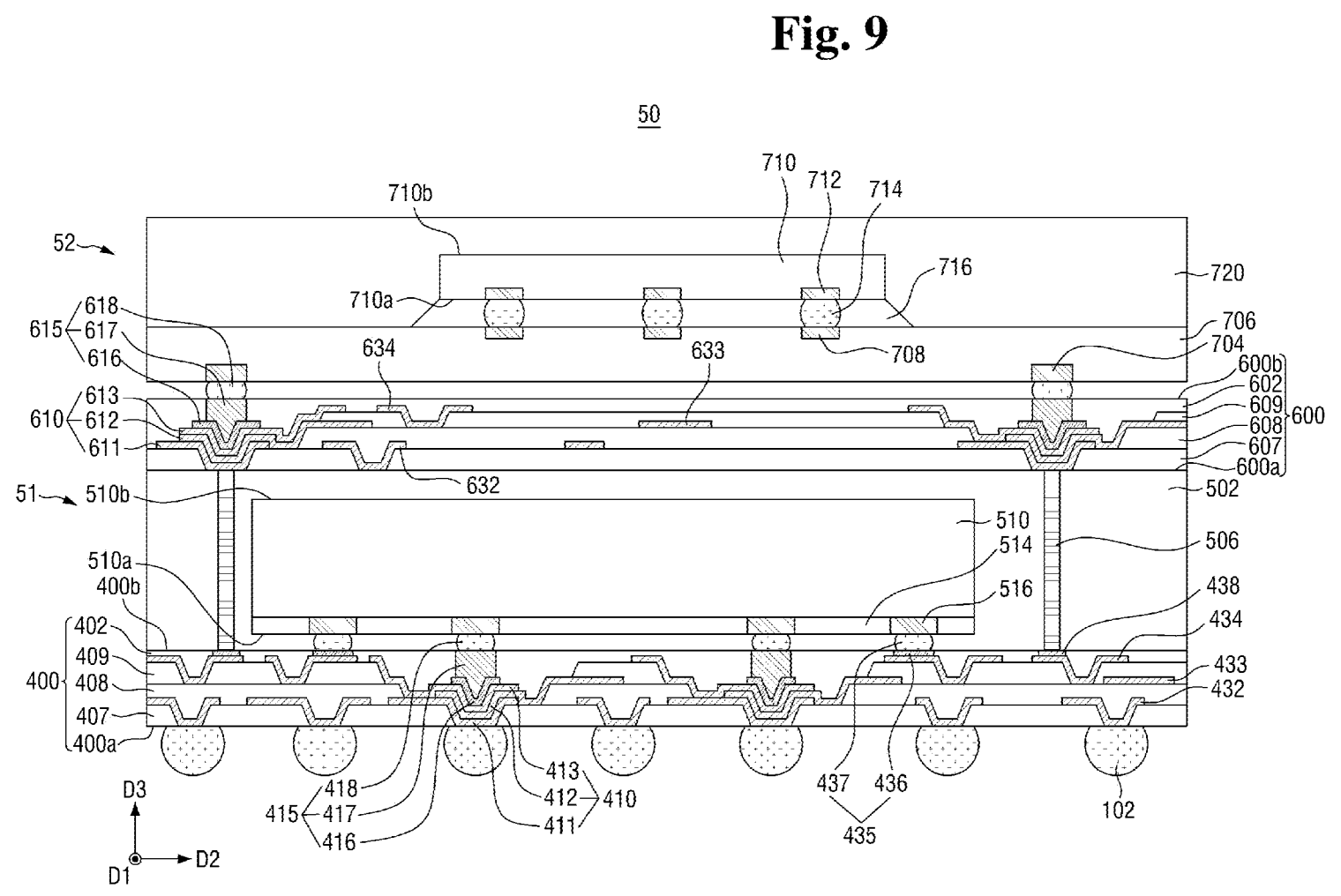

Referring to FIG. 9, a semiconductor package 50 according to some other example embodiments of the present disclosure may include an internal connection terminal 102, a first chip package 51, a stack via bump 615, and a second chip package 52.

The internal connection terminals 102 may be disposed on a bottom surface of the first chip package 51.

The first chip package 51 may include a lower redistribution layer 400 and an upper redistribution layer 600. The internal connection terminal 102 may be disposed on a first surface 400*a* of the lower redistribution layer 400. Although not illustrated, a connection pad may be included between the internal connection terminal 102 and the lower redistribution layer 400 according to the example embodiment. The connection pad may electrically connect the internal connection terminal 102 to the lower redistribution layer 400.

The first surface 400a of the lower redistribution layer 400 may be a lower surface with respect to a second surface 400b of the lower redistribution layer 400 in the third direction D3.

The lower redistribution layer 400 may correspond to the redistribution layer 200 of FIGS. 1 to 4. A first mold compound 402, first to third insulating layers 407 to 409, a first stack via 410, a first redistribution stack via bump 415, a first redistribution bump 435, and the second to fourth conductive wires 432 to 434 may correspond to the mold compound 202, the first to third insulating layers 207 to 209, the first stack via 210, the first redistribution stack via bump 215, the redistribution bump 235, and the second to fourth conductive wires 232 to 234 of FIGS. 1 to 4, respectively.

A first semiconductor chip 510 may be disposed on the second surface 400b of the lower redistribution layer 400. A first connection pad 516 may be disposed on a first surface 510a of the first semiconductor chip 510, and the first connection pad 516 may be included by a first passivation layer 514 and a partial area thereof may be exposed by the first passivation layer 514.

The first connection pad 516 may be overlappingly disposed on the first redistribution stack via bump 415 and the first redistribution bump 435 in plan view to be electrically connected to the lower redistribution layer 400 through the first redistribution stack via bump 415 and the first stack via 410. Accordingly, the first connection pad 516 may overlap the pad area of each of the first to third conductive layers 411 to 413 in plan view.

A first through via 506 may be disposed on the lower redistribution layer 200. The first through vias 506 may be disposed at both sides of the first semiconductor chip 510. The first through vias 506 may be disposed to penetrate a first molding layer 502 in the third direction D3. The first through via 506 may be electrically connected to the lower redistribution layer 200 through a lower connection pad 438 on the fourth conductive wire 434. Accordingly, the first through via 506 may be electrically connected to the first semiconductor chip 510.

The first molding layer 502 may be disposed on the lower redistribution layer 400. The first molding layer 502 may surround the first semiconductor chip 510 and the first through via 506. The first molding layer 502 may be disposed between the first semiconductor chip 510 and the first through via 506. The first molding layer 502 may cover an outer side surface of the first semiconductor chip 510.

The upper redistribution layer 600 may be disposed between a second surface 510b of the first semiconductor chip 510 and a first surface 710a of a second semiconductor chip 710, and a first surface 600a of the upper redistribution layer 600 may be in contact with the first molding layer 502.

The upper redistribution layer 600 may correspond to the redistribution layer 200 of FIGS. 1 to 4. A second mold compound 602, fourth to sixth insulating layers 607 to 609, a second stack via 610, a second redistribution stack via bump 615, and sixth to eighth conductive wires 632 to 634 may respectively correspond to the mold compound 202, the first to third insulating layers 207 to 209, the first stack via 210, the first redistribution stack via bump 215, and the second to fourth conductive wires 232 to 234 of FIGS. 1 to 4.

The upper redistribution layer 600 may be in contact with the first through via 506 and may be electrically connected to a fourth conductive layer 611.

The first through via 506 may be disposed below the second stack via 610 and overlap the second stack via 610 in plan view to be electrically connected to the upper redistribution layer 600 through the second stack via 610. Accordingly, the first through via 506 may overlap the pad area of each of the fourth to sixth conductive layers 611 to 613 in plan view.

The second chip package 52 may be disposed on the second surface 600b of the upper redistribution layer 600. The second chip package 52 may be disposed to be stacked with the first chip package 51 in the third direction D3. The second redistribution stack via bump 615 may electrically connect the upper redistribution layer 600 to the second chip package 52.

The second chip package 52 may include a substrate 706, the second semiconductor chip 710, and a second molding layer 720. The substrate 706 may be, for example, a PCB substrate. The second semiconductor chip 710 may be disposed on the substrate 706. The second semiconductor chip 710 may be disposed on the top surface of the substrate 706. The second molding layer 720 may be disposed on the substrate 706 and the second semiconductor chip 710. The second molding layer 720 may be disposed along the side surface of the second semiconductor chip 710 and the top surface of the substrate 706. The second molding layer 720 may expose a second surface 710b of the second semiconductor chip 710.

The second redistribution stack via bump 615 may electrically connect the upper redistribution layer 600 to the second semiconductor chip 710 through a substrate connection pad 704, a second chip pad 708, and chip connection terminals 712 and 714.

Figure 10:
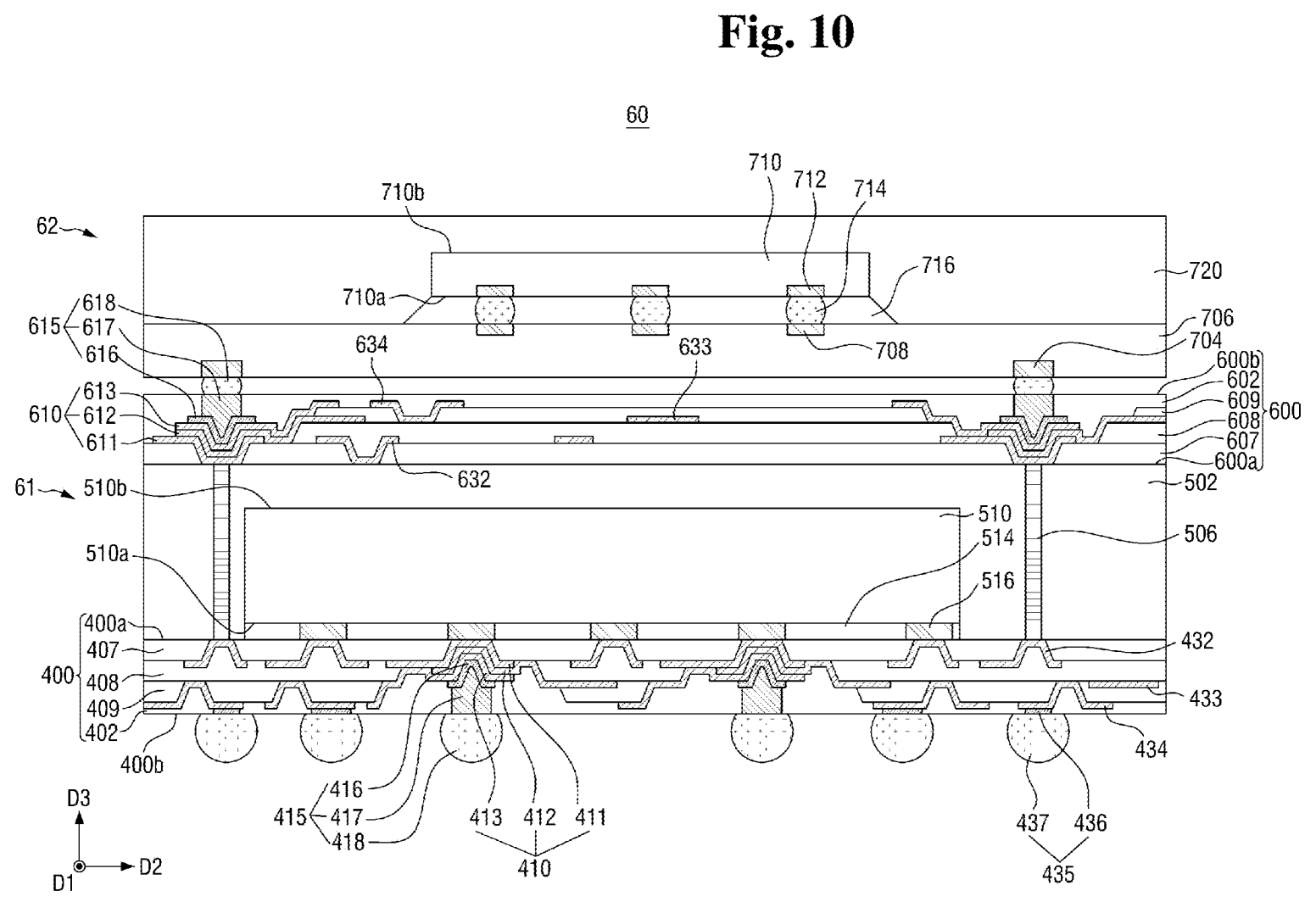

FIG. 10 is a diagram illustrating a semiconductor package 60 according to some other example embodiments of the present disclosure. The differences from the semiconductor package 50 of FIG. 9 will be mainly described.

The lower redistribution layer 400 may be vertically inverted with respect to the third direction D3 to be in contact with the first molding layer 502 and the first semiconductor chip 510. Accordingly, the second surface 400b of the lower redistribution layer 400 is disposed below the first surface 400a of the lower redistribution layer 400 with respect to the third direction D3.

Accordingly, the first connection pad 516 may be disposed on the first conductive layer 411 or the second conductive wire 432 of the first stack via 410 to be electrically connected thereto. In addition, the first through via 506 may be disposed on the second conductive wire 432 to be electrically connected thereto.

Compared with the semiconductor package 50 of FIG. 9, instead of the internal connection terminal 102, the first redistribution stack via bump 415 and the first redistribution bump 435 may be disposed at a lower portion with respect to the third direction D3, and in the semiconductor package 60 as described above, the lower redistribution layer 400 may be sequentially formed on the first surface 510a of the first semiconductor chip 510.

Figure 11:
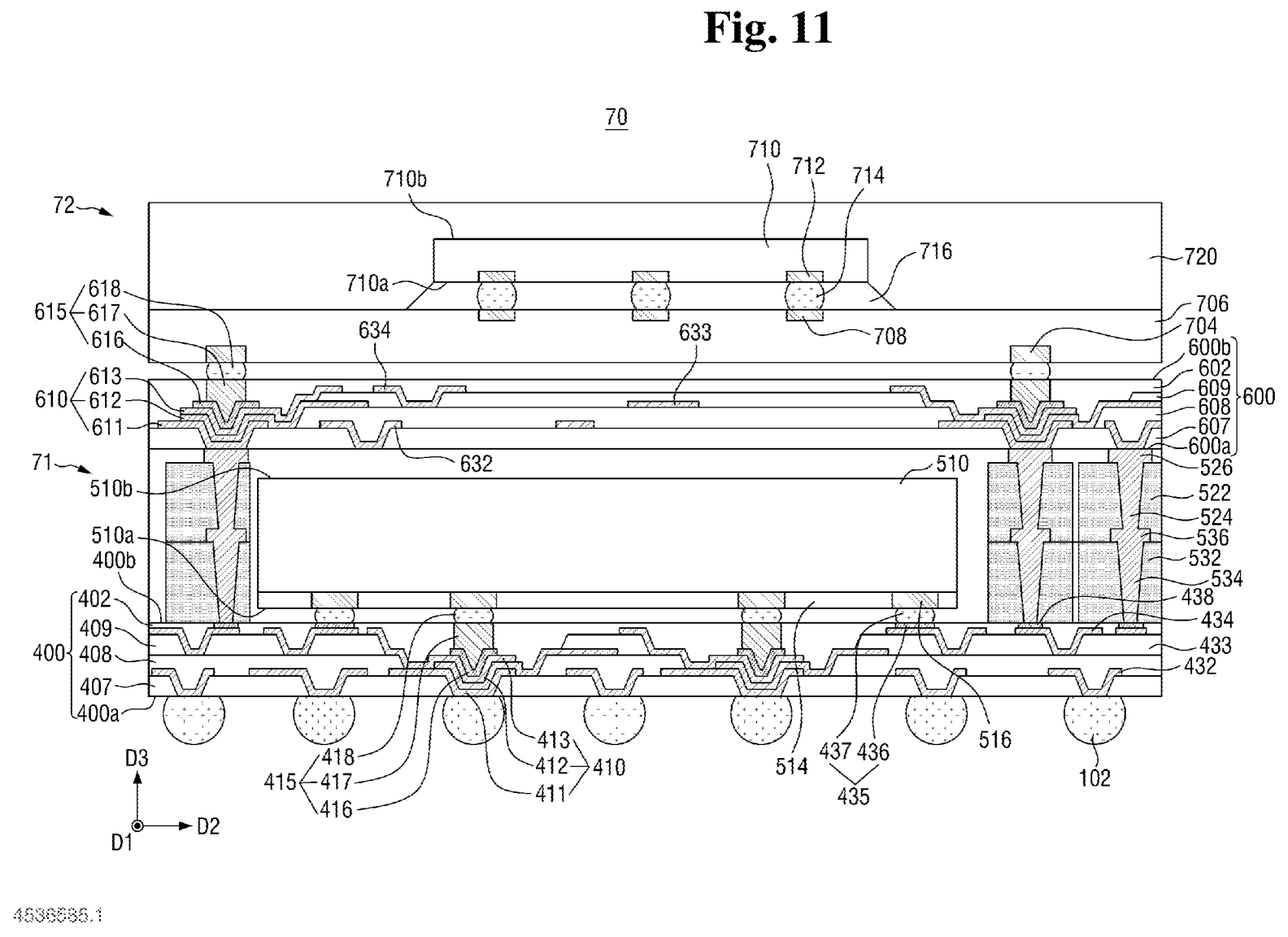

FIG. 11 is a diagram illustrating a semiconductor package 70 according to some other embodiments of the present disclosure. The differences from the semiconductor package 50 of FIG. 9 will be mainly described.

The first molding layer 502 may include a plurality of core insulating layers 522 and 532, a plurality of core wiring layers 526 and 536, and a plurality of core vias 524 and 534. In this drawing, although it is illustrated that the core layer includes only the first and second core insulating layers 522 and 532, the first and second core wiring layers 526 and 536, and the first and second core vias 524 and 534, this is exemplary, and the number, position, or disposition of the core insulating layers 522 and 532, the core wiring layers 526 and 536, and the core vias 524 and 534 may vary.

The first and second core vias 524 and 534 may penetrate the first and second core insulating layers 522 and 532, respectively, to connect the first and second core wiring layers 526 and 536 and the lower connection pad 438 with each other. For example, the first core via 524 may penetrate the first core insulating layer 522 to connect the first core wiring layer 526 to the second core wiring layer 536, and the second core via 534 may penetrate the second core insulating layer 532 to connect the second core wiring layer 536 to the lower connection pad 438. The upper redistribution layer 600 and the lower redistribution layer 400 may be electrically connected according to the connection relation.

The first and second core wiring layers 526 and 536 and the first and second core vias 524 and 534 may include a conductive material. Accordingly, electrical paths connecting the top and bottom surfaces may be formed within the core layer. The first and second core wiring layers 526 and 536 and the first and second core vias 524 and 534 may include at least one of, for example, copper (Cu), aluminum (Al), silver (Ag), tin (Sn), gold (Au), nickel (Ni), lead (Pb), titanium (Ti), and an alloy thereof, but is not limited thereto.

However, the effects of the example embodiments are not restricted to the one set forth herein. The above and other effects of the example embodiments will become more apparent to one of daily skill in the art to which the present disclosure pertains by referencing the claims.

What is claimed is:

1. A semiconductor package comprising:
a first semiconductor chip including a first surface and a second surface opposite to the first surface; and
a redistribution layer on the first surface of the first semiconductor chip, the redistribution layer configured to electrically connect to the first semiconductor chip, the redistribution layer including,
a first insulating layer including a first trench having an oblique first inner sidewall,
a first conductive layer lining the first trench and including a first sidewall extending along the oblique first inner sidewall of the first trench and a first bottom surface extending along a bottom surface of the first trench,
a second insulating layer disposed on the first insulating layer and including a second trench overlapping with the first trench, the second trench having an oblique second inner sidewall extending at a same angle as the oblique first inner sidewall,
a second conductive layer lining the second trench and including a second sidewall extending along the oblique second inner sidewall of the second trench and a second bottom surface extending along a bottom surface of the second trench, and
a pillar disposed on the second conductive layer,
wherein the pillar overlaps with the first bottom surface of the first conductive layer and the second bottom surface of the second conductive layer,
wherein a first width of the first sidewall of the first conductive layer is greater than a second width of the second sidewall of the second conductive layer, and
wherein a level difference of the first conductive layer within the first trench is same as a level difference of the second conductive layer within the second trench.

2. The semiconductor package of claim 1, wherein the first conductive layer further includes a first extension part extending along a top surface of the first insulating layer and extending from the first sidewall, and
wherein the second insulating layer covers a portion of the first extension part.

3. The semiconductor package of claim 2, wherein the second trench exposes the first sidewall and the first bottom surface of the first conductive layer.

4. The semiconductor package of claim 2, wherein the first extension part extends in a first direction, and a width of the first extension part in a second direction intersecting the first direction is smaller than a width of the first trench in the second direction.

5. The semiconductor package of claim 2, wherein the second conductive layer further includes a second extension part extending along the top surface of the first insulating layer, the oblique second inner sidewall of the second trench and a top surface of the second insulating layer and extending from the second sidewall.

6. The semiconductor package of claim 2, wherein the second sidewall of the second conductive layer is spaced apart from the oblique second inner sidewall of the second trench.

7. The semiconductor package of claim 1, wherein the first width between the first sidewall of the first conductive layer is measured at a first height from the bottom surface of the first trench,
the second width between the second sidewall of the second conductive layer is measured at a second height from the first bottom surface of the first conductive layer, and
the first height and the second height are same and the first width measured at the first height is greater than and the second width measured at the second height.

8. The semiconductor package of claim 1, wherein a distance from a topmost surface of the first conductive layer overlapping the first trench to the first bottom surface of the first conductive layer and a distance from a topmost surface of the second conductive layer overlapping the first trench to the second bottom surface of the second conductive layer are same.

9. The semiconductor package of claim 1, wherein the pillar fills between the second sidewall and the second bottom surface.

10. A semiconductor package comprising:
a first semiconductor chip including a first surface and a second surface opposite to the first surface; and
a redistribution layer on the first surface of the first semiconductor chip, the redistribution layer configured to electrically connect to the first semiconductor chip, the redistribution layer including,
a first insulating layer including a first trench,
a first conductive layer including a first pad area extending along the first trench and a first wiring area extending along the first insulating layer,
a second insulating layer on the first conductive layer and the first insulating layer and including a second trench,
a second conductive layer including a second pad area extending along the first pad area and a second wiring area extending along the second insulating layer, and
a pillar disposed on the second conductive layer,
wherein the second trench overlaps with the first trench and exposes the first pad area, wherein the pillar overlaps with the first trench and the second trench, and wherein a first width between a first inner sidewall of the first trench is smaller than a second width between a second inner sidewall of the second trench.

11. The semiconductor package of claim 10, wherein the second pad area contacts the first pad area.

12. The semiconductor package of claim 10, wherein a first height of the first pad area and a second height of the second pad area are same.

13. The semiconductor package of claim 10, wherein the first pad area and the second pad area are spaced apart from the second inner sidewall of the second trench.

14. The semiconductor package of claim 10, wherein the first wiring area and the second wiring area extend in a opposite direction in a plan view.

15. The semiconductor package of claim 10, wherein the second pad area covers the first pad area in a plan view.

16. The semiconductor package of claim 10, wherein the first wiring area extends in a first direction, and a width of the first wiring area in a second direction intersecting the first direction is smaller than a width of the first pad area in the second direction.

17. The semiconductor package of claim 10, wherein the pillar overlaps with the first pad area and the second pad area.

18. The semiconductor package of claim 10, wherein wherein the second insulating layer covers a portion of the first wiring area.

19. A semiconductor package comprising:

a first semiconductor chip including a first surface and a second surface opposite to the first surface; and a redistribution layer on the first surface of the first semiconductor chip, the redistribution layer configured to electrically connect to the first semiconductor chip, the redistribution layer including, a first insulating layer including a first trench, a first conductive layer including a first pad area extending along the first trench and a first wiring area extending along the first insulating layer, a second insulating layer on the first conductive layer and the first insulating layer and including a second trench, a second conductive layer including a second pad area extending along the first pad area and a second wiring area extending along the second insulating layer, and a pillar disposed on the second conductive layer, wherein, the second trench overlaps with the first trench and exposes the first pad area, a first width between a sidewall of the first pad area of the first conductive layer is measured at a first height from a first bottom surface of the first trench, a second width between a sidewall of the second pad area of the second conductive layer is measured at a second height from a second bottom surface of the first conductive layer, the first height and the second height are same and the first width measured at the first height is greater than the second width measured at the second height, and a third width between a first inner sidewall of the first trench is smaller than a fourth width between a second inner sidewall of the second trench.

20. The semiconductor package of claim 19, wherein the redistribution layer further including:

a third insulating layer on the second conductive layer and the first insulating layer and including a third trench, and a third conductive layer including a third pad area extending along the second pad area and a third wiring area extending along the third insulating layer, wherein the third pad area is disposed under the pillar, wherein the third trench overlaps with the first trench and the second trench, wherein a fifth width between a third inner sidewall of the third trench is greater than the third width and the fourth width, and wherein a sixth width between a sidewall of the third pad area is smaller than the first width and the second width.

* * * * *